(12) United States Patent
Kuan (10) Patent No.: US 8,384,191 B2
(45) Date of Patent: Feb. 26, 2013

(54) STACK CAPACITOR STRUCTURE AND FORMING METHOD

(75) Inventor: Shih-Fan Kuan, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 13/115,116

(22) Filed: May 25, 2011

(65) Prior Publication Data

US 2012/0299153 A1 Nov. 29, 2012

(51) Int. Cl.
*H01L 21/02* (2006.01)
(52) U.S. Cl. ......................................... 257/532; 257/303
(58) Field of Classification Search .................. 257/532, 257/303

See application file for complete search history.

(56) References Cited

U.S. PATENT DOCUMENTS

2010/0267215 A1* 10/2010 Park .............................. 438/397

* cited by examiner

*Primary Examiner* — Douglas Menz
(74) *Attorney, Agent, or Firm* — Winston Hsu; Scott Margo (57) ABSTRACT

The present invention discloses a stack capacitor structure and method of making the same. The top plate of the stack capacitor structure is connected to each other through a connecting node. The method of forming the stack capacitor structure includes providing an insulating substrate with a doped insulating material layer disposed therein. Then, the insulating substrate is patterned to form a trench, wherein an inner sidewall of the trench has a first region and a second region and the doped insulating material layer within the second region is entirely removed to form a hole. Later, a top plate is formed to surround the inner sidewall of the trench, and the top plate fills in the hole. Next, a capacitor dielectric layer is formed to surround the top plate. Finally, a storage node is formed to fill up the trench.

4 Claims, 12 Drawing Sheets

STACK CAPACITOR STRUCTURE AND FORMING METHOD

BACKGROUND OF THE INVENTION

1. Field of the Invention

The present invention relates to a stack capacitor structure and a method of forming a stack capacitor structure. More specifically, the present invention relates to a stack capacitor structure having a connecting node for coupling two adjacent top plates, and a method of forming the stack capacitor structure.

2. Description of the Prior Art

As high density and high performance are required for a DRAM, cell capacitor technology needs to be developed to provide the required performance. Various types of capacitors have been proposed, such as a trench type and a stack type.

Generally, an increase in the cell capacitance can be achieved by both using high-k materials and increasing the surface area of the storage node. Even when high-k materials are used, much effort must be focused on enlarging the storage node surface area to maximize the cell capacitance. The surface area of a storage node is mostly increased by increasing the height since the design rule limits the horizontal dimension of the storage node.

However, if the capacitor is too high, the capacitor may collapse during the fabricating processes.

SUMMARY OF THE INVENTION

This in mind, the present invention provides a stack capacitor structure and a fabricating method which can prevent the stack capacitor from collapse.

According to one aspect of the invention, a method of forming a stack capacitor includes the steps of: providing an insulating substrate with at least one doped insulating material layer disposed therein. Then, the insulating substrate is patterned to form a trench, wherein an inner sidewall of the trench has a first region and a second region, and the doped insulating material layer within the second region is entirely removed to form a hole. Then, a top plate is formed to surround the inner sidewall of the trench, and the top plate fills in the hole. Later, a capacitor dielectric layer is formed to surround the top plate. Finally, a storage node is formed to fill up the trench.

According to another aspect of the invention, a stack capacitor structure includes a first capacitor. The first capacitor comprises a first cylindrical storage node, a first capacitor dielectric layer surrounding the first cylindrical storage node and a first top plate surrounding the first capacitor dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. However, it will be apparent to one skilled in the art that the invention may be practiced without these specific details. In order to avoid obscuring the present invention, some well-known system configurations and process steps are not disclosed in detail.

Likewise, the drawings showing embodiments of the apparatus are semi-diagrammatic and not to scale and, particularly, some of the dimensions are for the clarity of presentation and are shown exaggerated in the figures. Also, in which multiple embodiments are disclosed and described having some features in common, for clarity and ease of illustration and description thereof, like or similar features will ordinarily be described with like reference numerals.

FIG. 1 to FIG. 12 depict a method of forming a stack capacitor schematically according to a first preferred embodiment of the present invention.

Figure 1:
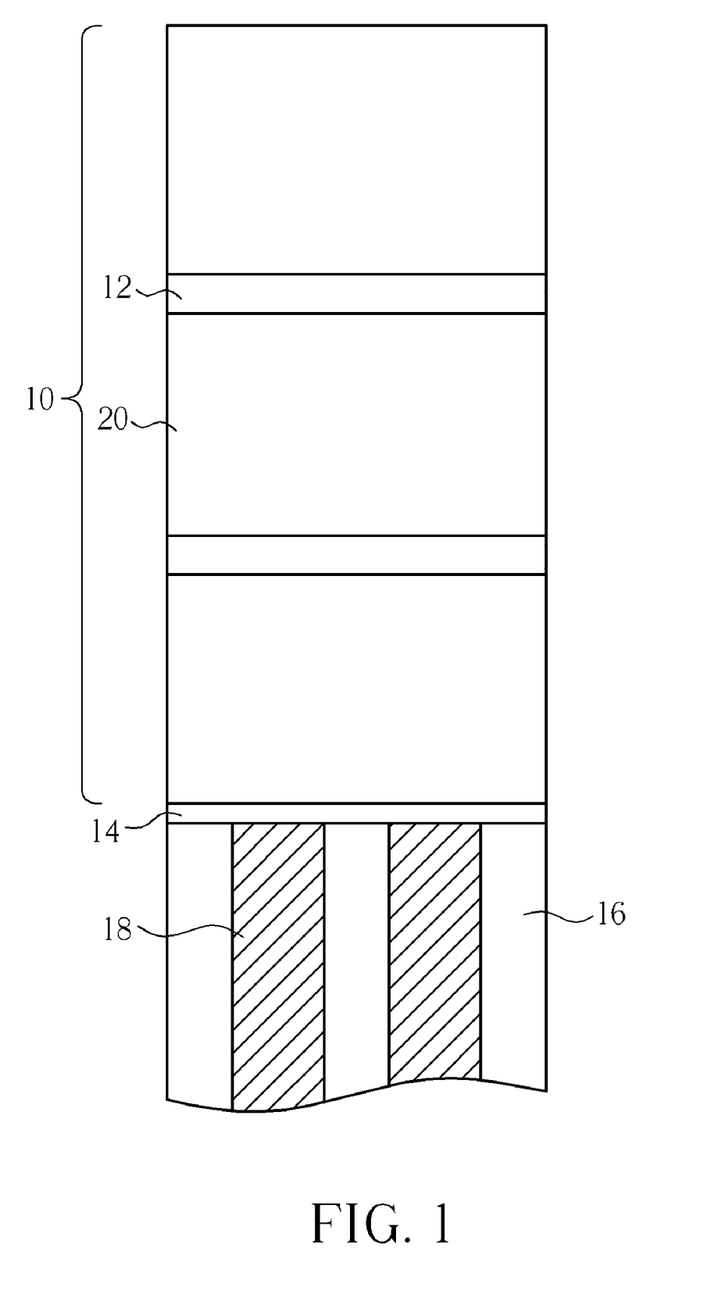
FIG. 1 to FIG. 12 depict a method of forming a stack capacitor schematically according to a first preferred embodiment of the present invention.

As shown in FIG. 1, an insulating substrate 10 is provided. The insulating substrate 10 includes at least one doped insulating material layer 12 disposed within it.

The insulating substrate 10 may be silicon oxide. The doped insulating material layer 12 may be silicon oxide doped with P or B. The doped insulating material layer 12 is not limited to one layer. There can be numerous doped insulating material layers 12 positioned in the insulating substrate 10.

A silicon nitride layer 14 can be optionally disposed on one surface of the insulating substrate 10. The silicon nitride layer 14 maybe disposed on a dielectric layer 16 with at least one contact plug 18 inside.

The insulating substrate 10 can be formed by a deposition process by depositing an insulating material layer 20 and the doped insulating material layer 12 alternately. The insulating material layer 20 may be silicon oxide. For example, firstly, the insulating material layer 20 can be deposited on the silicon nitride layer 14. Then, the doped insulating material layer 12 can be formed on the insulating material layer 20 by another deposition process. The deposition process can be repeated several times to form the doped insulating material layer 12 and the insulating material layer 20 alternately. Then, the insulating substrate 10 can be formed.

Figure 2:
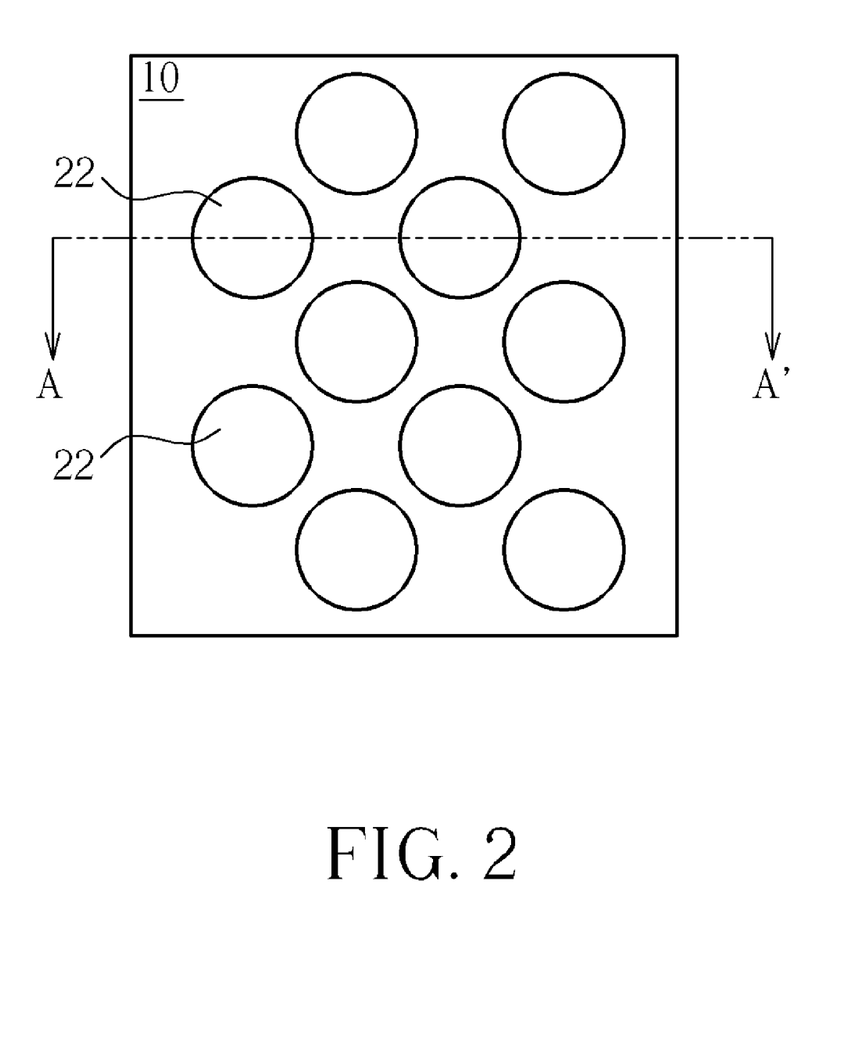
Figure 3:
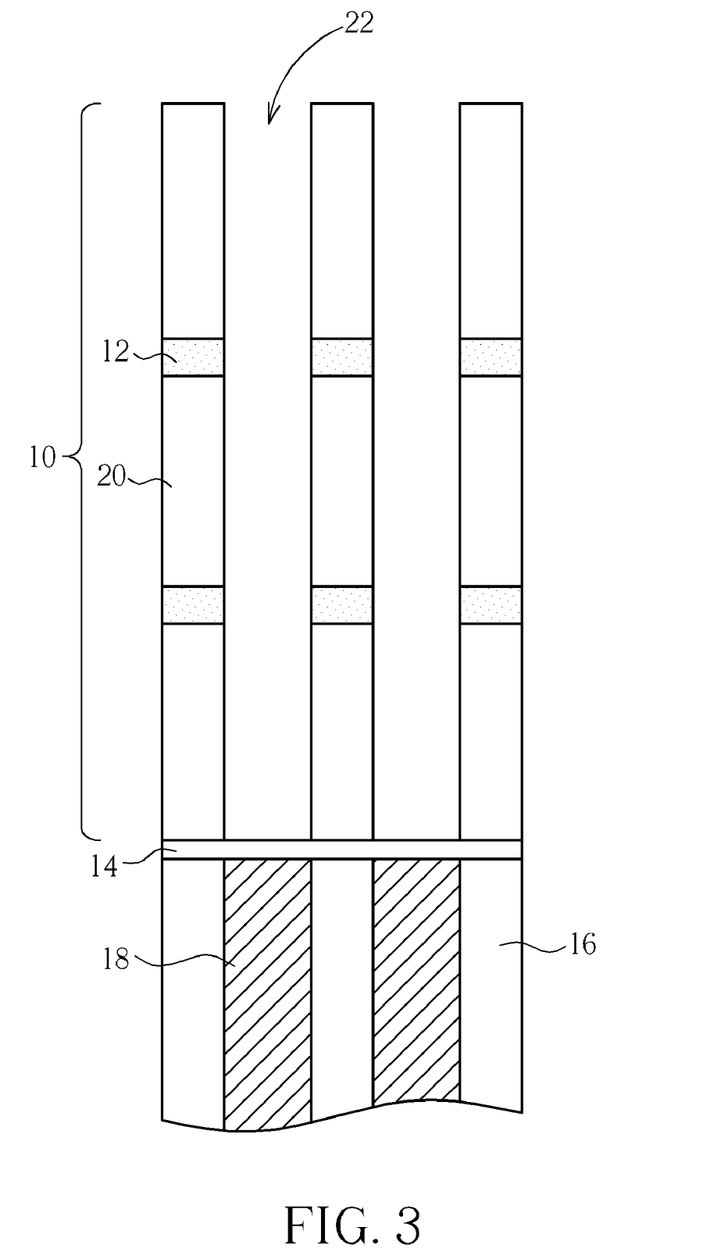

FIG. 2 is a schematic layout diagram showing a plurality of trenches. FIG. 3 shows a schematic, cross-sectional view of FIG. 2, which is taken along line AA'.

As shown in FIG. 2 and FIG. 3, at least one trench 22 is formed in the insulating substrate 10. The silicon nitride layer 14 serves as a bottom of the trench 22. The number of the trench 22 is not limited to one, a plurality of trenches 22 can be formed based on different process requirements.

Figure 4:
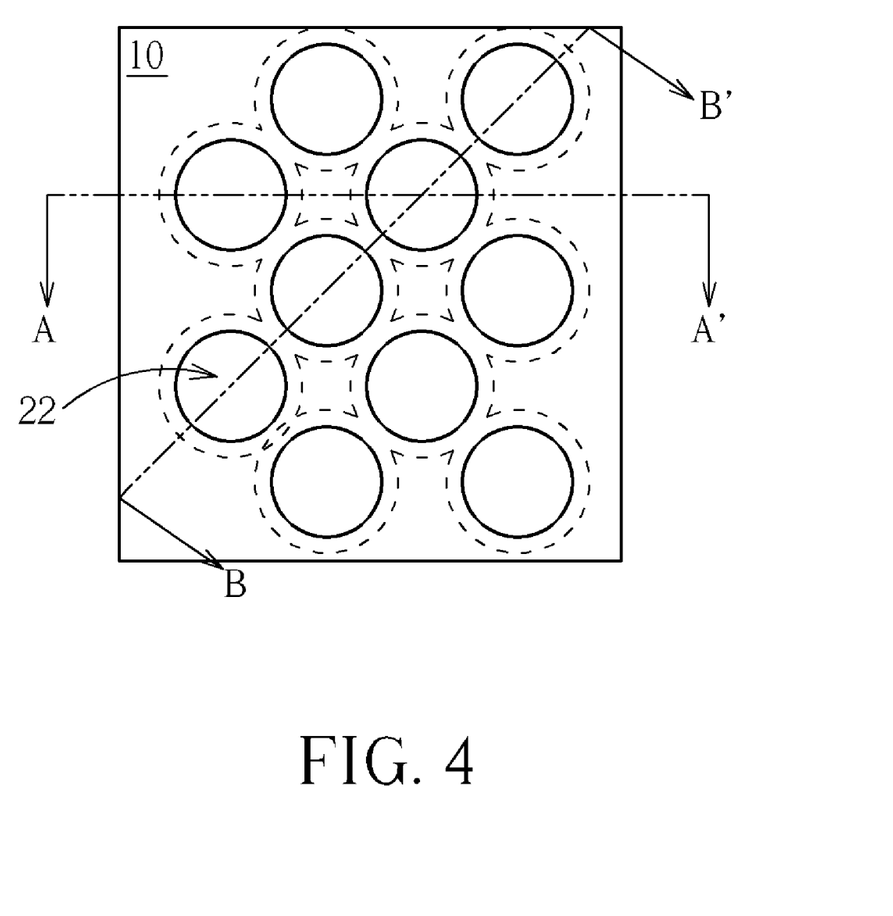
Figure 5:
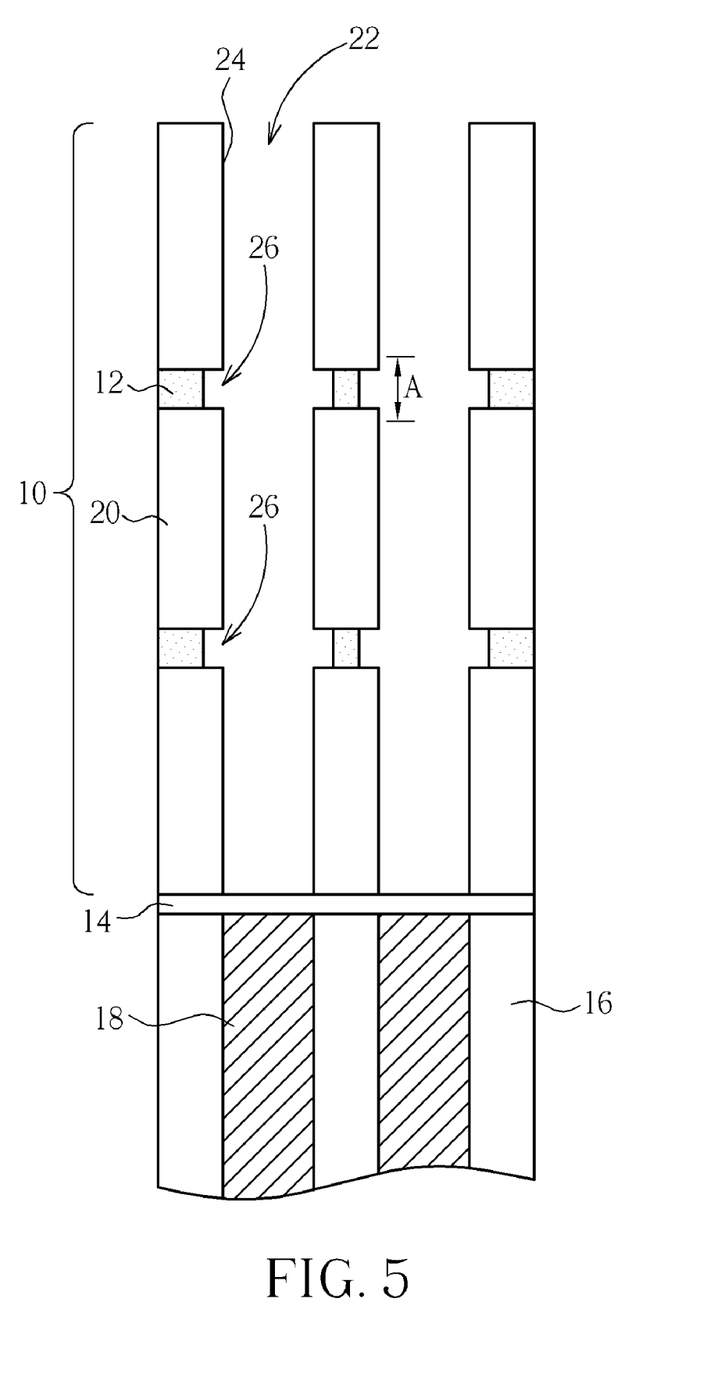
Figure 6:
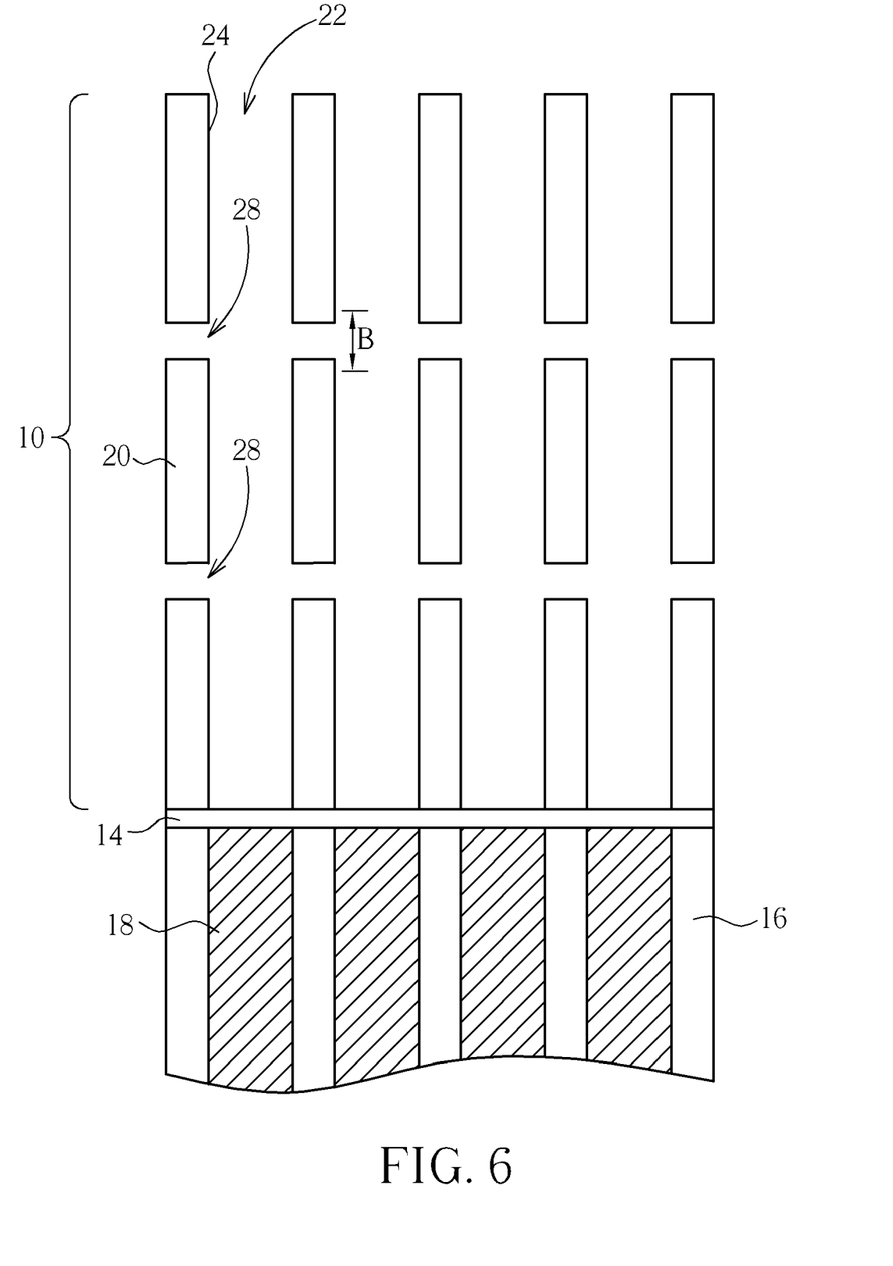

FIG. 4 is a schematic layout diagram showing trenches. FIG. 5 shows a schematic, cross-sectional view of FIG. 4, which is taken along line AA'. FIG. 6 shows a schematic, cross-sectional view of FIG. 4, which is taken along line BB'. Please refer to FIGS. 4 to 6. The trenches 22 can be wet etched by DHF. Because the doped insulating material layer 12 contains B or P, the doped insulating material layer 12 has higher etching resistibility than the insulating material layer 20 has with respect to the same wet etch solution. In other words, during the wet etching process, the doped insulating material layer 12 is etched faster compared to the insulating material layer 20. Consequently, as shown in FIG. 5 and FIG. 6, an inner sidewall 24 of each of the trenches 22 has a region A and a region B. Both of the region A and the region B include the doped insulating material layer 12. After the trenches 22 are wet etched, the doped insulating material layer 12 within the region A is partly removed, and some doped insulating material layer 12 is remained in the region A. The remained doped insulating material layer 12 within the region A and the insulating material layer 20 form a recess 26. The insulating material layer 20 serves as a sidewall of the recess 26, and the doped insulating material layer 12 serves as a bottom of the recess 26 for supporting the insulating material layer 20.

The doped insulating material layer 12 within the region B is entirely removed so that a hole 28 is formed within the region B. The dotted line in FIG. 4 shows positions of the exposed surface of the doped insulating material layer 12.

Figure 7:
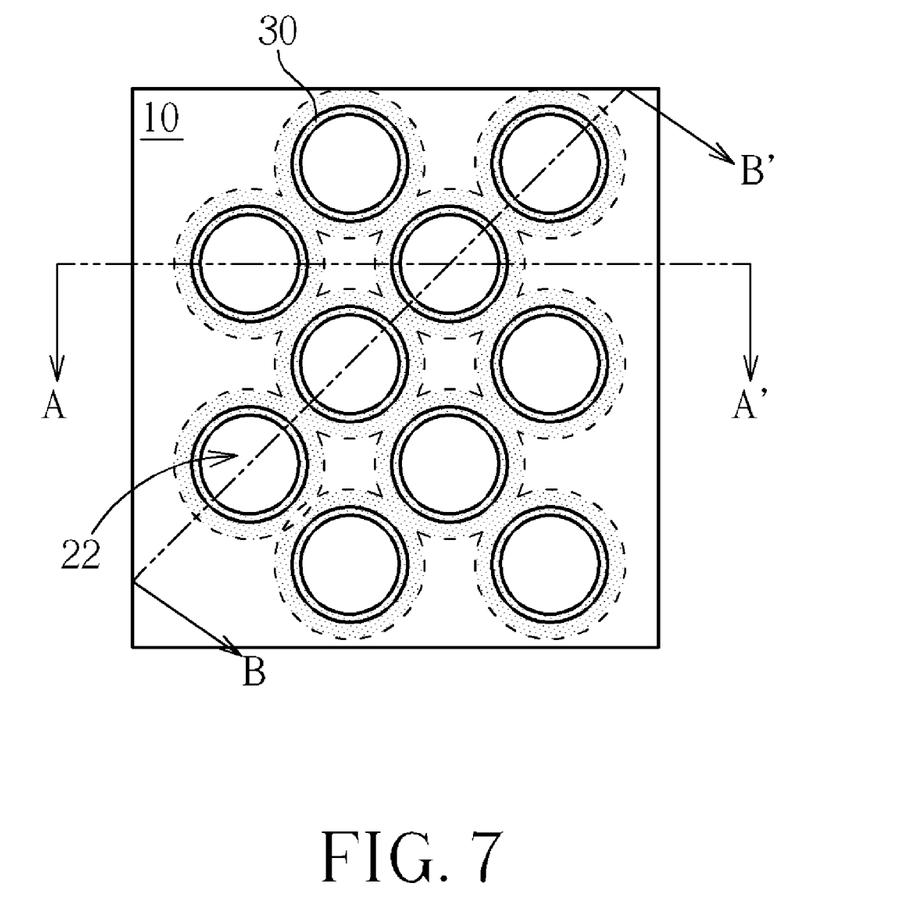
Figure 8:
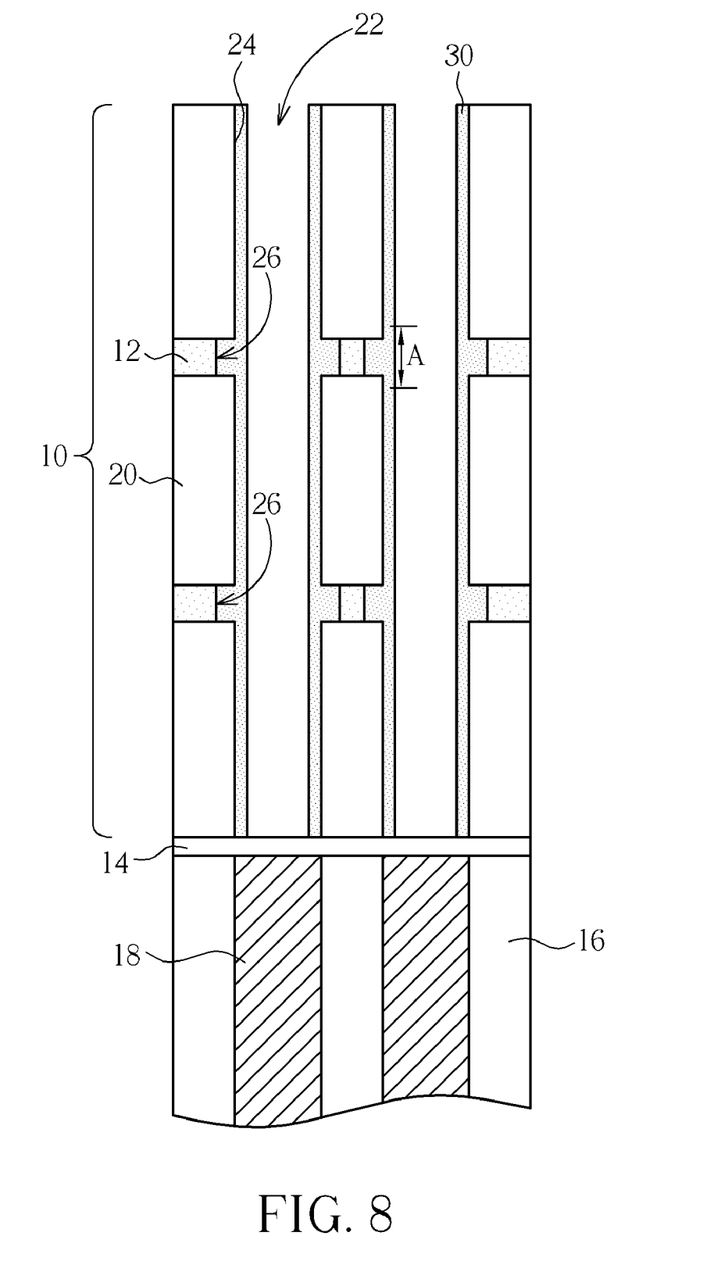
Figure 9:
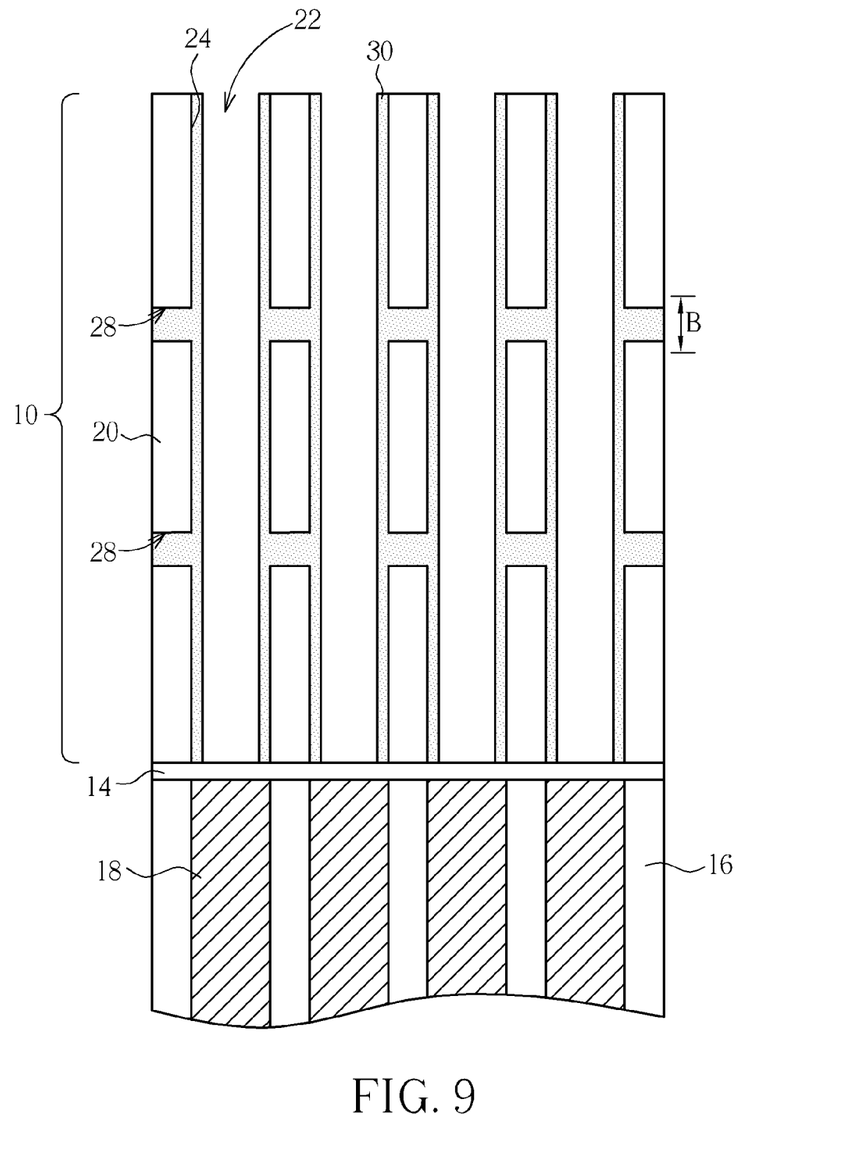

FIG. 7 is a schematic layout diagram showing a top plate formed in the trenches. FIG. 8 shows a schematic, cross-sectional view of FIG. 7, which is taken along line AA'. FIG. 9 shows a schematic, cross-sectional view of FIG. 7, which is taken along line BB'. Please refer to FIGS. 7 to 9. A top plate 30 is formed on the inner sidewall 24 of each of the trenches 22. The top plate 30 fills up the recess 26 and the hole 28.

Figure 10:
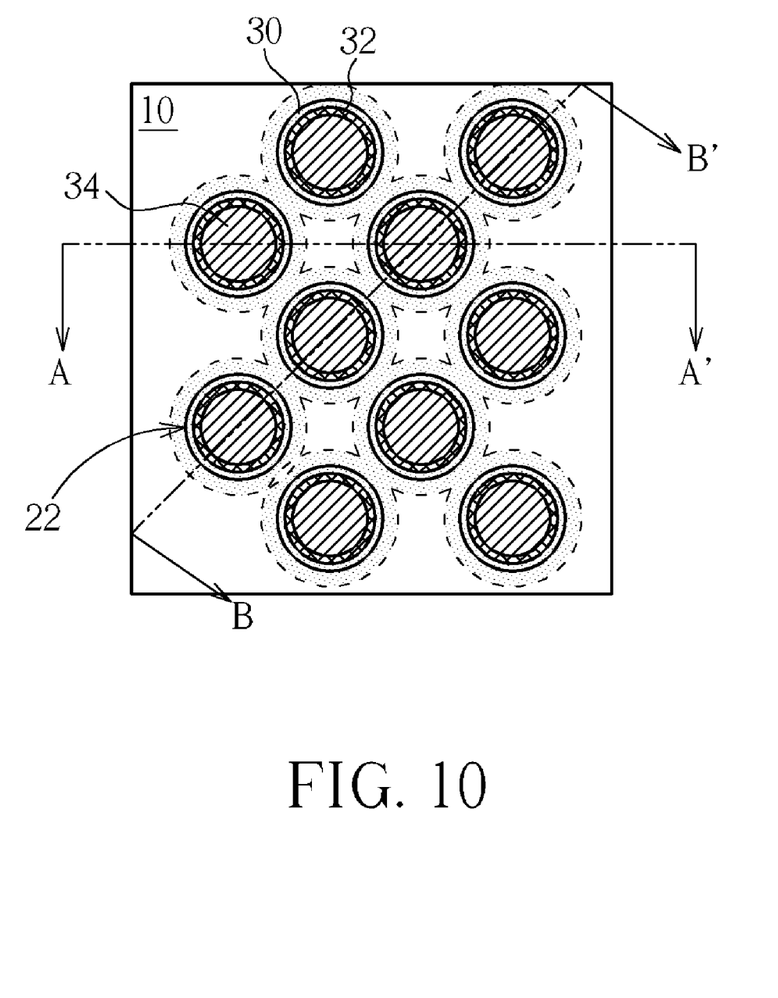
Figure 11:
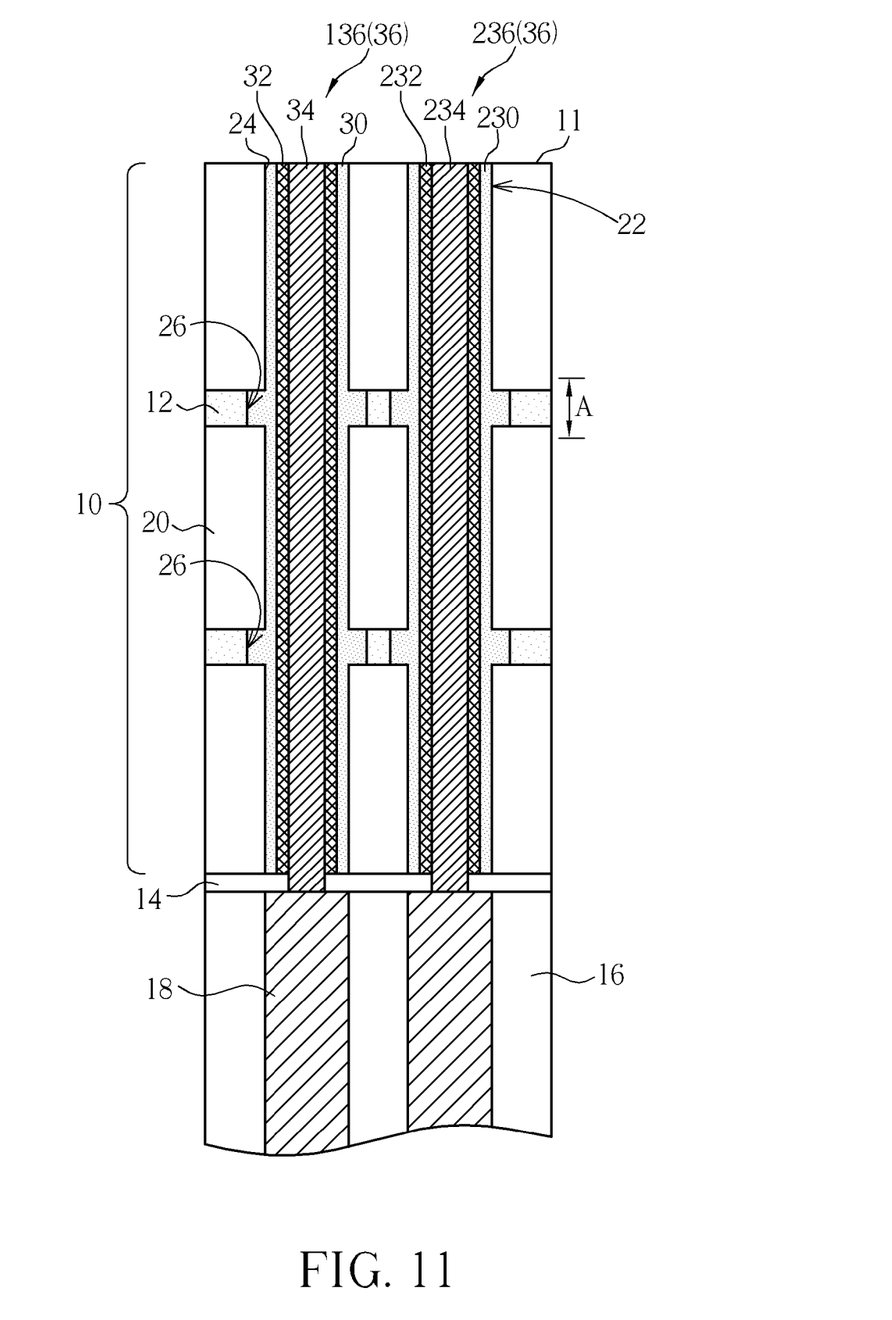
Figure 12:
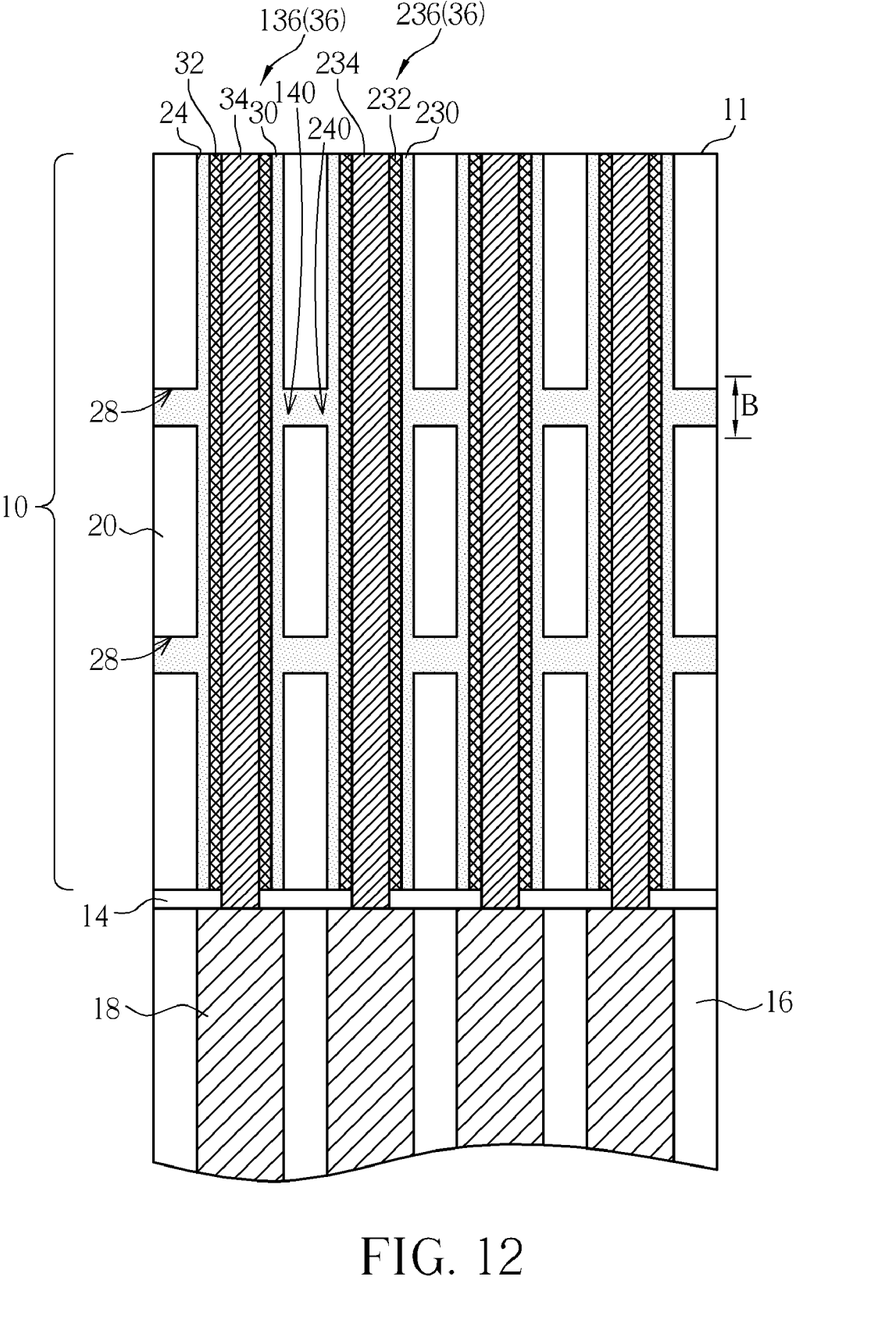

FIG. 10 is a schematic layout diagram showing a stack capacitor structure. FIG. 11 shows a schematic, cross-sectional view of FIG. 10, which is taken along line AA'. FIG. 12 shows a schematic, cross-sectional view of FIG. 10, which is taken along line BB'. As shown FIG. 10 to FIG. 12, a capacitor dielectric layer 32 is formed to surround the sidewall of the top plate 30. Later, part of the silicon nitride layer 14 is etched to expose the contact plug 18. Next, a storage node 34 is formed to fill up each of the trenches 22 and cover a top surface 11 of the insulating substrate 10. The storage node 34 contacts the contact plug 18. After that, the storage node 34 is planarized to remove the storage node 34 on the top surface 11 of the insulating substrate 10. Therefore, storage node 34 in each of the trenches 22 is isolated from each other. Now, a stack capacitor structure 36 of the first preferred embodiment of the present invention is completed.

According to a second preferred embodiment of the present invention, a stack capacitor structure is provided. As shown in FIG. 10 to FIG. 12, a stack capacitor structure 36 including a first capacitor 136 and a second capacitor 236 is disposed in an insulating substrate 10. The insulating substrate 10 includes at least one doped insulating material layer 12 disposed within it.

The insulating substrate 10 may be silicon oxide. The doped insulating material layer 12 may be silicon oxide doped with P or B. The doped insulating material layer 12 is not limited to one layer. There can be numerous doped insulating material layers 12 positioned in the insulating substrate 10. A silicon nitride layer 14 can be optionally disposed on one surface of the insulating substrate 10. The silicon nitride layer 14 may be disposed on a dielectric layer 16.

Please still refer to FIG. 10 to FIG. 12, a plurality of trenches 22 is disposed in the insulating substrate 10. An inner sidewall 24 of each trench 22 has a region A and a region B. A recess 26 is disposed within the region A. More specifically, the doped insulating material layer 12 serves as a bottom of the recess 26, and the insulating material layer 20 serves as a sidewall of the recess 26. The region B has a hole 28, and the region B does not have any doped insulating material layer 12.

The first capacitor 136 is disposed in one of the trenches 22. The first capacitor 136 includes a storage node 34, a capacitor dielectric layer 32 surrounding the storage node 34 and a top plate 30 surrounding the capacitor dielectric layer 32. The storage node 34 is cylindrical. The top plate 30 does not cover the top surface 11 of the insulating substrate 10. Furthermore, the top plate 30 surrounds the inner sidewall 24 of the trench 22. Additionally, the top plate 30 is disposed in the recess 26 and the hole 28. The top plate 30 in the hole 28 is defined as a connecting node 140.

A second capacitor 236 is disposed in one of the trenches 22 adjacent to the first capacitor 136. The second capacitor 236 basically has the same structure as that of the first capacitor 136. The second capacitor 236 includes a storage node 234, a capacitor dielectric layer 232 surrounding the storage node 234 and a top plate 230 surrounding the capacitor dielectric layer 232. The storage node 234 is cylindrical. The top plate 230 does not cover the top surface 11 of the insulating substrate 10. Similarly, the top plate 230 is also disposed in the recess 26 and the hole 28. The top plate 230 in the hole 28 is defined as a connecting node 240. Therefore, the top plate 30 couples to the top plate 230 through connecting nodes 140, 240. Particularly, the connecting nodes 140, 240 and the top plates 30, 230 format least one H shape when view from a cross sectional view.

Moreover, at least one contact plug 18 is disposed in the dielectric layer 16. Each of the capacitors 136, 236 has one contact plug 18 couples to each of the storage nodes 34, 234 of the capacitors 136, 236, respectively.

The present invention forms connecting nodes by utilizing different etch rates of the insulating material layer and the doped insulating material layer. The connecting node couples top plates of adjacent stack capacitors. The stack capacitor structure of the present invention has a strong structure which can prevent the stack capacitor from collapsing.

Those skilled in the art will readily observe that numerous modifications and alterations of the device and method may be made while retaining the teachings of the invention.

What is claimed is:
1. A stack capacitor structure, comprising:
an insulating substrate with at least one doped insulating material layer disposed therein;
a trench is disposed in the insulating substrate, wherein the trench has an inner sidewall with a first region and a second region, the second region has a hole, and the first region has a recess with the doped insulating material layer serving as a bottom for supporting the insulating material layer;
a first capacitor disposed in the trench comprising:
a first cylindrical storage node;
a first capacitor dielectric layer surrounding the first cylindrical storage node; and
a first top plate surrounding the first capacitor dielectric layer; and
a second capacitor disposed adjacent to the first capacitor, wherein the second capacitor comprises:
a second cylindrical storage node;
a second capacitor dielectric layer surrounding the second cylindrical storage node; and
a second top plate surrounding the second capacitor dielectric layer and coupling to the first top plate of the first capacitor through a connecting node, wherein the connecting node is disposed in the hole.

2. The stack capacitor structure of claim 1, further comprising a contact plug coupling the first storage node.

3. The stack capacitor structure of claim 1, wherein the connecting node, the first top plate and the second top plate form an H shape.

4. The stack capacitor structure of claim 1, wherein a part of the first top plate is disposed in the recess.

* * * * *